(12) United States Patent
Hunt et al.

(10) Patent No.: US 6,632,591 B2
(45) Date of Patent: Oct. 14, 2003

(54) NANOLAMINATED THIN FILM CIRCUITRY MATERIALS

(76) Inventors: Andrew T. Hunt, 495 Mountain Way, Atlanta, GA (US) 30342; Wen-Yi Lin, 610 Pleasantdale Crossing, Doraville, GA (US) 30340; Richard W. Carpenter, 178 Wyok Rd., Johnson City, NY (US) 13790

( * ) Notice: Subject to any disclaimer, the term of this patent is extended or adjusted under 35 U.S.C. 154(b) by 0 days.

(21) Appl. No.: 09/781,462

(22) Filed: Feb. 12, 2001

(65) Prior Publication Data

US 2001/0012600 A1 Aug. 9, 2001

Related U.S. Application Data

(62) Division of application No. 09/427,769, filed on Oct. 27, 1999, now Pat. No. 6,212,078.

(51) Int. Cl.[7] .................................................. G03F 7/00
(52) U.S. Cl. ...................... 430/314; 430/311; 430/313; 430/317; 430/318; 430/320
(58) Field of Search .............................. 430/311, 313, 430/314, 317, 318, 320

(56) References Cited

U.S. PATENT DOCUMENTS

| | | | |
|---|---|---|---|
| 4,574,255 A | 3/1986 | Fujii et al. ..................... 331/25 |
| 4,799,128 A | 1/1989 | Chen ........................... 361/795 |
| 5,079,069 A | 1/1992 | Howard et al. ............... 428/209 |
| 5,155,655 A | 10/1992 | Howard et al. ............... 361/303 |
| 5,161,086 A | 11/1992 | Howard et al. ............. 361/321.1 |
| 5,261,153 A | 11/1993 | Lucas et al. .................... 29/830 |
| 5,311,406 A | 5/1994 | Snodgrass et al. ............ 361/792 |
| 5,347,258 A | 9/1994 | Howard et al. ............... 338/333 |
| 5,466,892 A | 11/1995 | Howard et al. ............... 174/261 |
| 5,574,630 A | 11/1996 | Kresge et al. ................ 361/792 |
| 5,596,309 A * | 1/1997 | Nabeshima et al. ........... 338/61 |
| 5,652,021 A | 7/1997 | Hunt et al. ................ 427/248.1 |
| 5,742,471 A * | 4/1998 | Barbee, Jr. et al. .......... 361/312 |
| 6,194,990 B1 * | 2/2001 | Lee et al. ..................... 338/320 |
| 6,232,042 B1 * | 5/2001 | Dunn et al. .................. 430/315 |
| 6,329,899 B1 * | 12/2001 | Hunt et al. .................. 338/308 |

* cited by examiner

Primary Examiner—Mark F. Huff
Assistant Examiner—Nicole Barreca

(57) ABSTRACT

Nanolaminates are formed by alternating deposition, e.g., by combustion chemical vapor deposition (CCVD), layers of resistive material and layers of dielectric material. Outer resistive material layers are patterned to form discrete patches of resistive material. Electrical pathways between opposed patches of resistive material on opposite sides of the laminate act as capacitors. Electrical pathways horizontally through resistive material layers, which may be connected by via plated holes, act as resistors.

3 Claims, 3 Drawing Sheets

NANOLAMINATED THIN FILM CIRCUITRY MATERIALS

This application is a divisional of application Ser. No. 09/427,769 filed Oct. 27, 1999 now U.S. Pat. No. 6,212,078.

The present invention is directed to thin film laminates used to form electronic circuitry that includes both resistors and capacitors, and to a method of manufacture of such structures.

BACKGROUND OF THE INVENTION

There is a continuing interest in printed circuitry miniaturization. In most printed circuit boards in use, circuitry traces are printed by conventional methods, particularly photoresist techniques. Accessory components such as capacitors and resistors are frequently provided as discrete components and soldered onto the printed circuitry, either manually or robotically. These components occupy "real estate" on the printed circuit board and may be difficult or expensive to apply to the board.

Accordingly, structures have been proposed in which components such as capacitors and/or resistors are provided along with circuitry traces by circuitization procedures. Examples of such structures are found in U.S. Pat. Nos. 5,079,069, 5,155,655, 5,161,086, 5,261,153, 5,347,258, and 5,466,892, the teachings of each of which are incorporated herein by reference. Typically, a plurality of such structures are laminated together with dielectric material to form multi-layer printed circuit boards.

The present invention is directed to a method of forming a thin, circuitized laminate structure that provides both capacitors and resistors, and to the thin layer circuitized laminate structure formed therefrom.

SUMMARY OF THE INVENTION

The present invention is directed to nanolaminated structures for forming passive electronic components including capacitors and resistors and to circuitized laminates which provide both capacitors and resistors. In its simplest form, a laminate in accordance with the invention comprises a layer of resistive material and a layer of dielectric material. Preferably, the laminate comprises three or more layers of resistive material alternating with two or more layers of dielectric material. Such laminates may be connected to electrical connects so as to form both capacitors and resistors.

IN THE DRAWINGS

DETAILED DESCRIPTION OF CERTAIN PREFERRED EMBODIMENTS

The present invention is directed to thin film circuitry which incorporates "conductive", "resistive" and "dielectric" materials. Appreciating the fact that these three terms lie on a continuum of resistivities, for purpose of the present invention, "conductive" materials have resistivities less than resistive materials. Resistive materials have resistances between about 1M$\Omega$/square and about 0.1 $\Omega$/square, preferably between about 100 k$\Omega$/square and about 1 $\Omega$/square, and most preferably between about 10 k$\Omega$/square and about 10 $\Omega$/square. Dielectric materials, particularly the dielectric materials used herein as the material separating conductive elements of a resistor, are those materials that have no electrons in their conduction bands, and as such have resistivities greater than those of resistive materials as defined herein.

For ease of explanation, circuitized structures will be initially described and methods of producing such structures are subsequently described.

Figure 1:
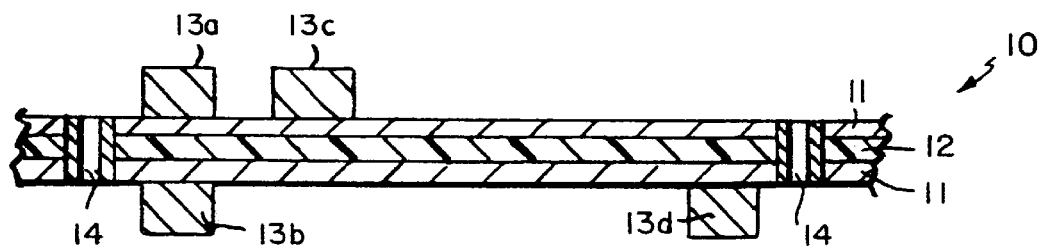
FIG. 1 is a cross-sectional view of a simple laminate in accordance with the invention circuitized so as to form structures including both capacitors and resistors.

Illustrated in FIG. 1 is a three layer laminate 10 in accordance with the present invention, the laminate 10 being circuitized to provide capacitors and resistors. This simple laminate comprises two layers of resistive material 11 sandwiching a layer 12 of dielectric material. In this laminate structure, the resistive material layer 11 is shown after being patterned to form discrete patches of resistive material. Electrical connects 13a–d are provided on the outside surfaces of the resistive material layer patches 11. Electrical connects 14 are represented as plated via holes.

Electrical connects 13a and 13b provide an electrical path vertically through the laminate 10 which functions as a capacitor, charge being held on either side of the dielectric material layer 12.

Electrical connects 14 provide an electrical pathway horizontally through patches of the resistive layers 11, this pathway functioning as a resistor.

Electrical connects 13c and 13d provide an electrical pathway which functions as a capacitor (vertically through the laminate) in series with a resistor (horizontally through resistive layer patches 11.

Figure 2:
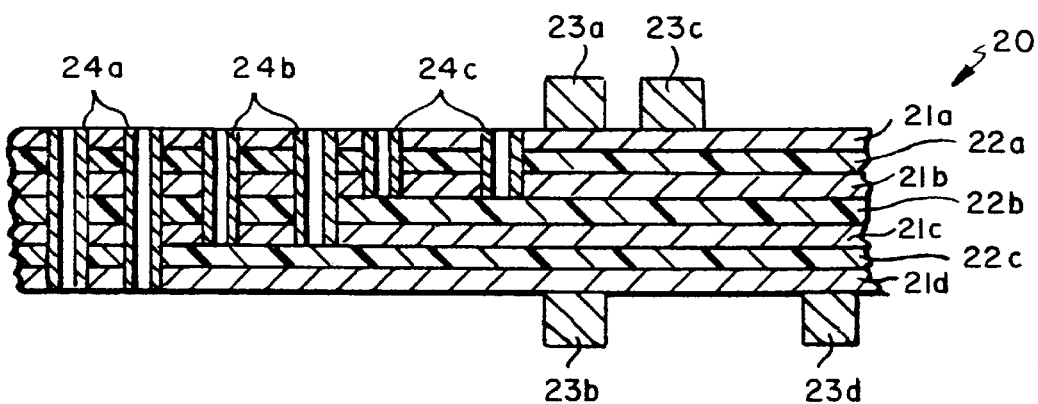
FIG. 2 is a cross-sectional view of a more complex laminate in accordance with the invention circuitized so as to form structures including both capacitors and resistors.

Preferably, a laminate in accordance with the present invention has three or more layers of resistive material, and two or more layers of dielectric material. Illustrated in FIG. 2 is circuitry formed from seven layer laminate 20 comprising four resistive material layers 21a–d alternating with three dielectric material layers 22a–c. The outer resistance layers 21a and 21d are illustrated as being patterned to form discrete resistors patches. It is to be noted here that neither the structure of FIG. 1 nor the structure of FIG. 2 has sufficient mechanical strength so as to be free-standing. Both of these structures must be supported, e.g., with dielectric material as described subsequently in respect to FIG. 6.

Electrical connects 23a and 23c on the outside surface of patches of resistive material layer 21a and electrical connects 23b and 23d on the outside surface of patches of resistive material layer 21d provide capacitor electrical pathways. The electrical pathway 23a to 23b is a simple capacitor pathway. The internal resistive material layers 21b and 21c have free electrons within the conductive band and function as dipoles, thereby enhancing the capacitance of capacitor pathway 23a to 23b relative to pathway 13a to 13c in FIG. 1. Electrical pathway 23c to 23d functions as a capacitor and a resistor in series.

Electrical connects 24a–24b are represented as plated via holes. Electrical connects 24a form a resistive pathway which runs through two resistive material layers 21b and 21c. Electrical connects 24b form a resistive pathway which runs only through resistive material layers 21b. Assuming equal horizontal spacing of connects 24a and 24b, the resistance of the 24b pathway is greater than the resistance of the 24a pathway.

The differences in resistivities between the illustrated resistive pathways may be enhanced through the use of resistive material layers of varying resistivities. For example, resistive material layer 21b may have a resistivity an order of magnitude greater than that of 21c. Then, assuming equal horizontal distances, the resistance of the 24b pathway is significantly greater than that of the 24a pathway.

The laminates of the present invention are preferably produced by successive deposition of resistive material layers and dielectric material layers by combustion chemical vapor deposition (CCVD) and/or by controlled atmosphere combustion chemical vapor deposition (CACCVD). Deposition of materials by CCVD is taught in U.S. Pat. No. 5,652,021 and U.S. patent application Ser. No. 08/691,853, the teachings of each of which are incorporated herein by reference. Deposition of materials by CACCVD is taught in U.S. Pat. Ser. No. 09/067,975, the teachings of which are incorporated herein by reference. CACCVD is preferably used for depositing materials with high oxidation potential, such as zero valence copper. Deposition of dielectric material layers for forming thin layer capacitor structures are taught in U.S. Pat. Ser. No. 09/283,100, the teachings of which are incorporated herein by reference.

Deposition of resistive material layers for forming thin layer resistor structures are taught in U.S. Pat. Ser. No. 09/198,954, the teachings of which are incorporated herein by reference.

The above-referenced patents and applications describe a variety of materials which may be deposited by CCVD and/or CACCVD and which may provide conductive material layers, resistive material layers and dielectric material layers and all such materials may be used to form structures in accordance with the present invention. Herein, by way of illustration, the invention will be described primarily in terms of using silica as the dielectric material as taught in above-referenced U.S. patent application Ser. No. 09/283, 100. Also herein, by way of illustration, the invention will be described primarily in terms of using silica-doped platinum as the resistive material as taught in above-referenced U.S. patent application Ser. No. 09/198,954. This patent application teaches that when platinum is doped with minor amounts (e.g., 0.5 to 5 wt %) of a dielectric material such as silica, the material becomes resistive with its resistivity highly dependent upon the amount of the dielectric material dopant. Thus, for example, silica-doped platinum layers may have resistivities differing by orders of magnitude, merely by varying the silica content of the platinum in the several layers. Both silica and silica-doped platinum are conveniently deposited by CCVD. The description of the invention with reference primarily to silica dielectric material layers and silica-doped platinum resistive layers is, however, by no means intended to be limiting.

Alternative methods of forming dielectric material layers and resistive material layers may be employed. For example, screen printing may be used to deposit resistive material on selected areas of an adjacent layer.

Following is a description of one method of forming the structure of FIG. 2. It will be appreciated by one with ordinary skill in the art that there are possible permutations and variations of the described method, and the described method is illustrative, but by no means intended to be limiting.

Figure 3:
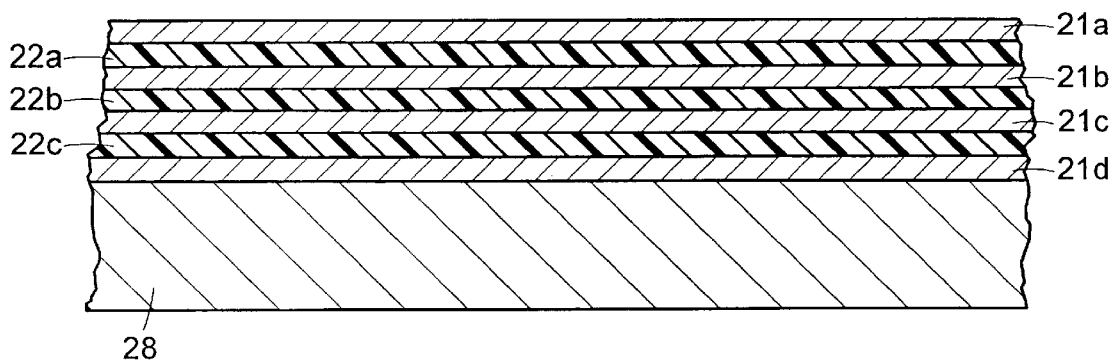
FIG. 3 is a cross-sectional view of a seven-layer laminate structure deposited on a support substrate, the laminate structure being useful in forming the structure of FIG. 2.

Illustrated in FIG. 3 is a structure formed by successively depositing layers by CCVD and CCVD on a support structure 28. For purposes of illustration, but not limitation, the support structure 28 is aluminum foil. Aluminum foil is advantageous in that materials deposited thereon, such as platinum, have relatively weak adherence to the aluminum due to the very thin layer of alumina that naturally forms on the surface of aluminum. This weak adherence allows for eventual subsequent release of the laminate structure.

Alternating layers of silica-doped platinum and silica are deposited by CCVD on one surface of the aluminum foil This can be accomplished by alternating the precursor solutions which are fed to the CCVD flame applicator or successively coating at a series of coating stations which alternately coat resistive and dielectric material. The resistive material layers are typically between about 10 and about 250 nanometers thick; the dielectric material layers typically between about 10 and about 750 manometers thick, although thicker layers are possible with other deposition techniques.

Electrical connects 23a and 23c are then deposited by pattern plating on resistive material layer 21a. In this process, a photoresist is applied to resistive material layer 21a, the photoresist is patterned by exposure to patterned actinic radiation, and developed in a standard photoimaging technique. Although layer 21a is "resistive", it is sufficiently conductive that it may be electroplated with copper. It is found that such electroplating can be accomplished on a material having up to 1 megaohm resistance. After electroplating, the remaining resist is stripped, leaving the electrical connects 23a and 23c as shown in FIG. 4.

Figure 4:
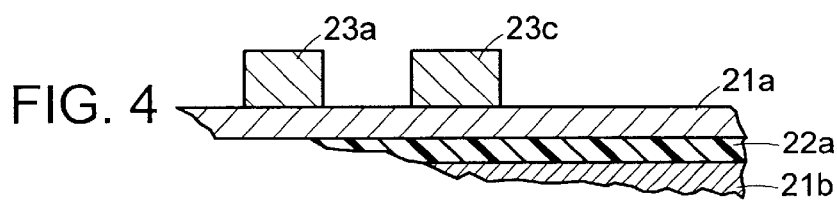
FIG. 4 is a partial cross-sectional view of the laminate of FIG. 3 in which one side of the laminate is circuitized.

Next, resistive material layer 21a is patterned to form the discrete patches of resistive material 21a seen in FIG. 4. To accomplish this, another photoresist is applied, exposed to patterned actinic radiation, and developed. The resistive material layer 21a is then etched. Although resistive material layer 21a is described herein as being silica-doped platinum, a noble metal, it can nevertheless be etched and is preferably etched by the ablative etch technique taught in above-referenced U.S. patent application Ser. No. 09/198,954. CCVD-deposited silica-doped platinum is porous, allowing an etchant for silica to seep through the silica-doped platinum layer 21a. The interface between the silica-doped platinum layer 21a and the underlying silica layer 22a is degraded; whereupon the silica doped platinum ablates away. Etching is discontinued before significant etching of the silica layer 22a occurs. Suitable silica etchants for effecting ablative etching include fluoroboric acid and ammonium hydrogen difluoride.

The side of the laminate opposite that of the aluminum foil support 28 is then embedded in dielectric material 29, e.g., fiberglass/epoxy prepreg in uncured form, and this material is then cured to harden the dielectric material so as to support the thin laminate structure. At this time, the aluminum foil support 28 is peeled away to expose resistive material layer 21d. The process of pattern electroplating electrical connects 23b, 23d and patterning resistive material layer 21d to form discreet patches of resistive material are repeated as per the other side of the laminate. This side of the laminate is then embedded in dielectric material 30 producing the structure illustrated in FIG. 6.

Figure 6:
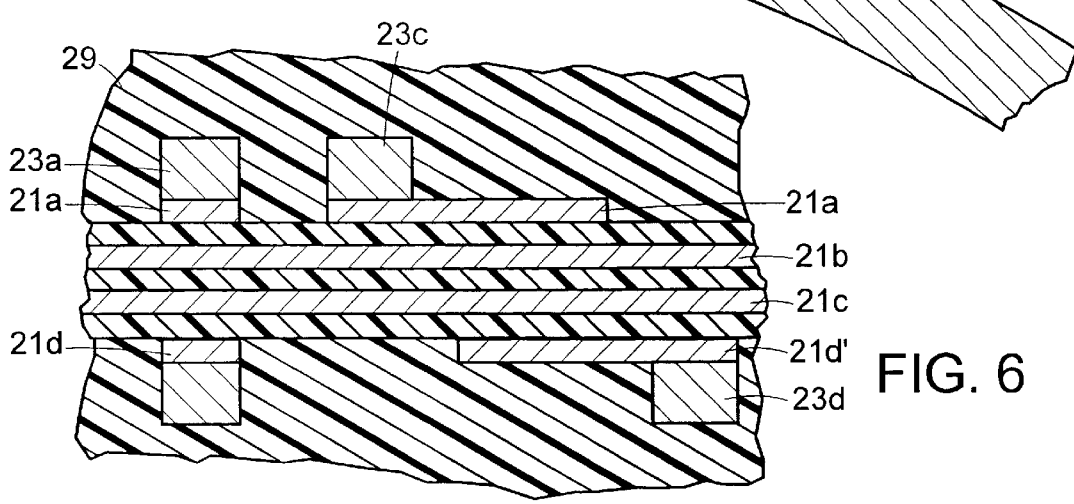
FIG. 6 is a partial cross-sectional view of a laminate structure in which the other side of the laminate structure is circuitized; the resistive material on this side of the laminate is patterned; and this side is embedded in dielectric material.

Typically, a plurality of structures of FIG. 6 will be layered in dielectric material layers, e.g., layers 29 and 30, in a multi-layer printed circuit board.

After successive layers of the FIGS. 2 and 6 structure, along with other structures, e.g., pure circuity layers, are laminated together to form a multi-layer printed circuit board, via holes, such as those illustrated in FIG. 2 as 24a–b, are formed and plated. As this process is conventional, it is not further illustrated herein.

A good deal of precision is required to form plated blind via holes 24b (FIG. 2) which extend partially into, but not all the way through the nanolaminated structure. This precision may be provided by laser drilling of the via holes with precise control of the energy used. Alternatively, blind via holes may be formed in a silica-doped platinum/silica laminate by timed etching with an etchant for silica, such as fluoroboric acid or ammonium hydrogen difluoride. By controlling conditions, such as time and temperature, depth of etching through a desired number of layers may be achieved.

Although providing via holes of varying depths to connect different number of resistive material layers as described in the above paragraph may be useful for providing significantly different resistances within a single laminate structure as per the FIG. 2 embodiment, the required precision in forming via holes to precise depths may be difficult, given the thinness of the layers, and may be unnecessary. In a multi-layer printed circuit board, a plurality of resistor/capacitor laminates along with a plurality of printed circuitry traces will generally be laminated together. Thus, it may be most convenient to provide significantly different resistances and capacitances in different laminates in a multi-layer printed circuit board.

The resistivities of the resistive material layers may be varied not only, as described above, by the dopant levels, but by the thicknesses of deposition of the several layers. Likewise, the thickness, chemical composition, etc. of the dielectric material layers may be varied to control factors such as the dielectric constant, lossyness, etc. of the dielectric material layers.

Figure 5:
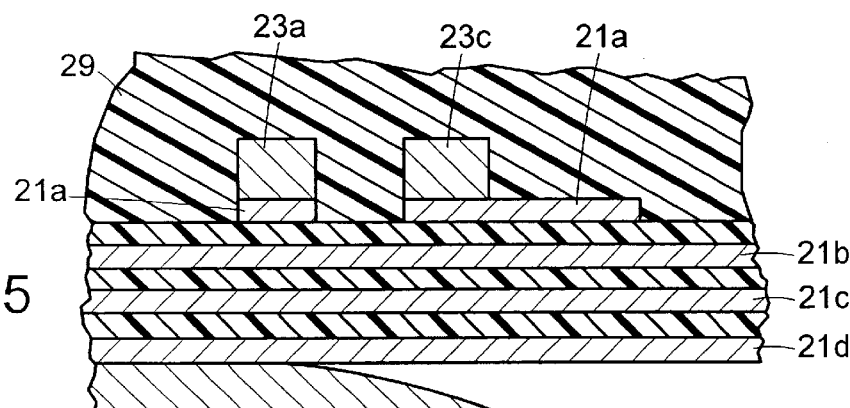
FIG. 5 is a partial cross-sectional view of a laminate structure in which the resistive material layer on the circuitized side of FIG. 4 is patterned; this side is embedded in dielectric material; and the support substrate is being peeled away.

To facilitate removal of the laminate from the support substrate, it may be desirable to deposit by CACCVD a very thin copper layer, e.g., between about 50 and about 2000 nanometers thick, before depositing resistive material layer 21d. After the support 28 is peeled away as per FIG. 5, either before or after pattern plating of electrical connects 23b, 23d, the copper layer may be removed by "rapid etching".

As noted above with respect to FIG. 1, an electrical pathway between electrical connects 13c and 13d is a resistor/capacitor (RC) pathway in which a resistors are in series with a capacitor. Such RC pathways are important in electronic circuitry.

Figure 7:
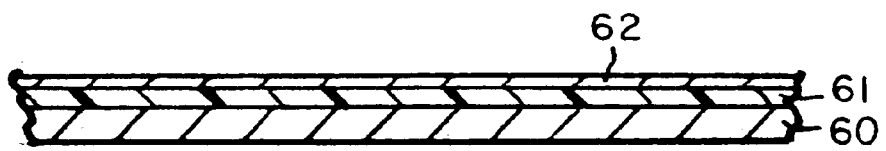
FIG. 7 is a cross-sectional view of a laminate useful for forming a resistor/capacitor (RC) network containing a plurality of resistors in series with capacitors.

Illustrated in FIG. 7 is a laminate for forming a RC network in which a plurality of resistor elements are in series with capacitor elements. This laminate comprises a metal foil 60 on which is deposited a dielectric material layer 61 between about 10 and about 750 nanometers thick and a resistive material layer 62 between about 10 and about 250 nanometers thick. The dielectric material layer is preferably a metal or metalloid oxide, most preferably silica. The dielectric material layer may be deposited by CCVD as described above, but may also be deposited by other deposition means known in the art, e.g., by screen printing. When some deposition methods are used (usch as screen printing), the resistive and dielectric layers can be as thick as several microns and even as much as 25 micros. The resistive material layer is preferably silica-doped platinum, but may also be a thin layer of metal, such as nickel or copper which is resistive due to the thinness of the material. Again, the resistive material may be deposited by CCVD or CACCVD, but other known deposition methods may be used.

Figure 8:
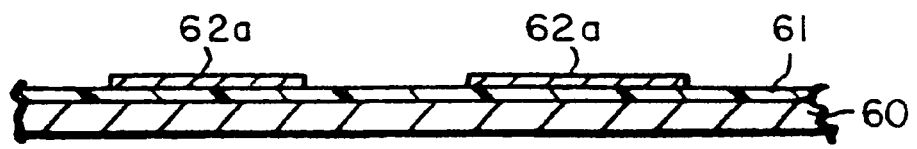
FIG. 8 is a cross-sectional view of the laminate of FIG. 6 in which a resistive material layer has been patterned to form discrete resistive material patches.

The thin resistive material layer 62 is then patterned to form discrete patches 62a of resistive material, preferably by a photoresist process as shown in FIG. 8. If the resistive material layer is silica-doped platinum, it may be patterned by an ablative etch technique as described above. Metals, such as thin layers of nickel or copper are patterned by conventional etchants.

Patches of resistive material could also be formed by a selective deposition process which deposits resistive material only on selective portions of the dielectric material layer. For example, a catalyst could be applied in a printed pattern to the dielectric material layer, and a thin metal resistive layer built up thereon by an electroless deposition process.

Patches of resistive material could also be formed by printing by screen, ink printers or other process, materials such as metal loaded polymers, metal pastes and other printable materials which are at least partially conductive when cured or treated, on selected portions of the dielectric material layer.

Figure 9:
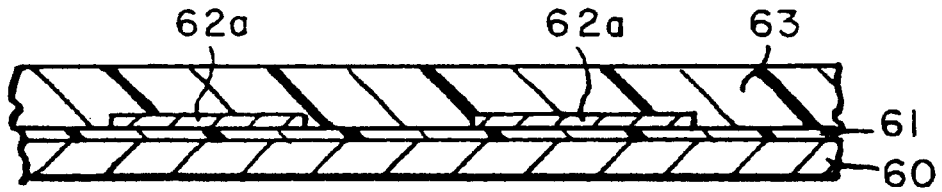
FIG. 9 is a cross-sectional view of the laminate of FIG. 7 in which the discrete resistive material layer patches have been embedded in dielectric material.

Next, as shown in FIG. 9, the resistive material patches 62 are embedded in a dielectric material layer 63 such as prepreg. This dielectric material layer is hardened to form a rigid supporting layer.

Figure 10:
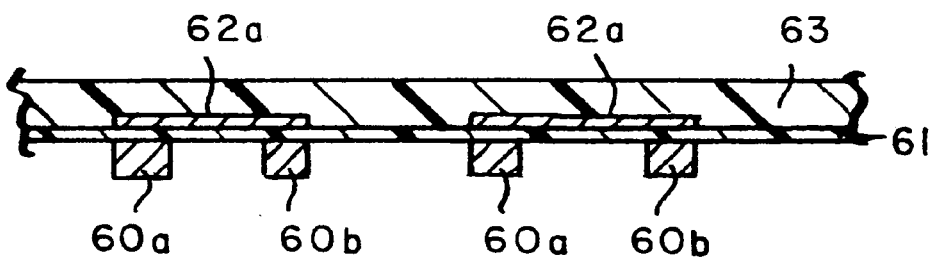
FIG. 10 is a cross-sectional view of the laminate of FIG. 8 in which a conductive material layer has been patterned so as to form resistor/capacitor elements.

Subsequently, as seen in FIG. 10, the foil 60 is patterned by a conventional photoresist techniques to form electrically connecting traces 60a and 60b. Between traces 60a and 60b is formed an electrical pathways combining the capacitances of 60a to 62a plus 62a to 60b plus the resistance through 62a.

Deposition conditions for forming the various resistive and dielectric laminates are as set forth in the following Examples.

EXAMPLE 1

Alternating layers of platinum and silica were deposited on a SiTiPt substrate as follows:

The solution for platinum deposition was prepared by first ultrasonically mixing 0.625 g of Pt-ac-ac with 84 ml of toluene. 384 ml of MeOH was then added to this mixture to produce a precursor having 0.33 wt % platinum (II) acetylacetonate, 19.30 wt % toluene and 80.37 wt % methanol.

The silica solution was prepared by mixing 12.25 g of TEOS with 6.65 g isopropyl alcohol and 240 g of propane to produce a precursor mixture having 0.87 wt % tetraethyloxysilane, 7.76 wt % isopropyl alcohol, and 91.37 wt % propane.

A substrate of SiTiPt was first coated using the silica solution via CCVD as the substrate was moved past the flame. The coating was applied using a precursor flow rate of 3 ml/min. for 30 sec. with a flame temperature of 800° C. After depositing the silica, the platinum precursor was used to coat over the silica using CCVD and moving the substrate past the flame. The platinum precursor was applied at a flow rate of 2 ml/min. for 15 seconds with a flame temperature of 550° C. These coatings were alternately applied for a total of 14 coatings of each with a final coating of the silica applied thereafter for a total of 29 layers. Each of the layers deposited was between 5–100 nm thick. Gold was sputtered onto the multilayer thin films to form electrodes. The capacitance of a 4.45 mm² section was measured as 1.83 nF, using a digital capacitance meter.

EXAMPLE 2

Alternating layers of platinum and silica were deposited on a glass substrate as follows:

The solution for platinum deposition was prepared by first ultrasonically mixing 0.625 g of Pt-ac-ac with 84 ml of toluene. 384 ml of MeOH was then added to this mixture to produce a precursor having 0.33 wt % platinum (II) acetylacetonate, 19.30 wt % toluene and 80.37 wt % methanol.

The silica solution was prepared by mixing 12.25 g of TEOS with 6.65 g isopropyl alcohol and 240 g of propane to produce a precursor mixture having 0.87 wt % tetraethyloxysilane, 7.76 wt % isopropyl alcohol, and 91.37 wt % propane.

A substrate of glass was first coated using the platinum solution via CCVD as the substrate was moved past the flame. The coating was applied using a precursor flow rate of 2 ml/min. for 15 sec. with a flame temperature of 550° C. After depositing the platinum, the silica precursor was used to coat over the platinum using CCVD and moving the substrate past the flame. The silica precursor was applied at a flow rate of 3 ml/min. for 30 seconds with a flame temperature of 800° C. These coatings were alternately applied for a total of 14 coatings of each with a final coating of the platinum applied thereafter for a total of 29 layers. Each of the layers deposited was between 5–100 nm thick.

EXAMPLE 3

A layer of Pt/SiO₂ resistive material was deposited by CCVD on polyimide using deposition conditions as follows:

| Solution preparation: | 1.23 g Pt(COD) |
| --- | --- |
| | 250 ml toluene |
| | 0.43 g TEOS (1.5 wt % Si in toluene) |
| | 150 g propane |
| Deposition conditions: | |
| Solution flow: | 3 ml/min |
| Deposition time: | ~18 mm for 5" × 6" substrate |

-continued

| # of passes: | 6 |
| --- | --- |
| Deposition temp. | 500° C. |
| Variac | 3.0A |
| Tip Oxygen flow: | ~2900 ml/min |

The sample described by the deposition conditions above yielded a resistance value of ~17 ohms per square.

This is an example of a 65% concentrated solution with 2.5 wt % SiO₂. The variables that can be changed include the amount of Pt (COD) and TEOS added proportionally to reach concentrations to 100% solution (e.g., 1.89 g Pt (COD) and 0.65 g TEOS (1.5 wt % Si)) and the amount of TEOS that can be added to change the resulting weight % SiO₂ (typically 0.5–5 wt % are used for this project).

What is claimed is:

1. A method of forming a structure which provides capacitance electrical pathways and resistance electrical pathways, the method comprising:

depositing on a substrate a first outer layer of resistive material between about 10 and about 250 nanometers thick, depositing thereon a layer of dielectric material between about 10 and about 750 nanometers thick, optionally depositing thereon alternating layers of resistive material, each between about 10 and about 250 nanometers thick, and dielectric material layers, each between about 10 and about 750 nanometers thick, depositing a second outer layer of resistive material between about 10 and about 250 nanometers thick, patterning said second outer layer of resistive material to form resistive material patches and providing electrical connects to said resistive material patches, laminating said second outer layer of resistive material to laminate-supportive dielectric material, removing said substrate from said first outer layer, patterning said first outer layer of resistive material to form resistive material patches and providing electrical connects to said resistive material patches, resistive material patches on opposed sides of said laminate providing capacitance electrical pathways, and providing electrical connects so as to form resistance electrically pathways horizontally through a resistive material layer(s) of said laminate.

2. The method of claim 1 wherein at least three resistive material layers are deposited and at least two dielectric materials are deposited.

3. The method of claim 1 wherein said electrical connects that form horizontal resistive electrical pathways are plated via holes.

* * * * *